(12) United States Patent
Stevens et al.

(10) Patent No.: US 10,678,969 B2
(45) Date of Patent: Jun. 9, 2020

(54) USAGE BASED LIFING

(71) Applicant: General Electric Company, Schenectady, NY (US)

(72) Inventors: Craig Wesley Stevens, Revere, MA (US); Simon Shu Kong Chan, Danville, CA (US); Siyu Wu, San Ramon, CA (US); Lauren Ashley Vahldick, Salem, MA (US); Ronald Burton Wight, Lisbon Falls, ME (US); Robert Alan Clements, Pacifica, CA (US)

(73) Assignee: General Electric Company, Schenectady, NY (US)

( * ) Notice: Subject to any disclaimer, the term of this patent is extended or adjusted under 35 U.S.C. 154(b) by 487 days.

(21) Appl. No.: 15/493,513

(22) Filed: Apr. 21, 2017

(65) Prior Publication Data
US 2018/0307784 A1      Oct. 25, 2018

(51) Int. Cl.
| | |
|---|---|
| *G06G 7/48* | (2006.01) |
| *G06F 30/20* | (2020.01) |
| *G07C 5/08* | (2006.01) |
| *G07C 5/00* | (2006.01) |
| *G06N 20/00* | (2019.01) |
| *F01D 21/14* | (2006.01) |
| *B64D 45/00* | (2006.01) |
| *G06F 30/15* | (2020.01) |

(52) U.S. Cl.
CPC ............. *G06F 30/20* (2020.01); *F01D 21/14* (2013.01); *G06N 20/00* (2019.01); *G07C 5/006* (2013.01); *G07C 5/0808* (2013.01); *B64D 2045/0085* (2013.01); *F05D 2260/80* (2013.01); *F05D 2260/81* (2013.01); *F05D 2270/11* (2013.01); *F05D 2270/71* (2013.01); *G06F 30/15* (2020.01)

(58) Field of Classification Search
None
See application file for complete search history.

(56) References Cited

U.S. PATENT DOCUMENTS

| | | | |
|---|---|---|---|
| 6,785,635 | B2 | 8/2004 | von Flotow |
| 6,832,205 | B1 | 12/2004 | Aragones et al. |
| 6,871,160 | B2 | 3/2005 | Jaw |
| 7,020,595 | B1 | 3/2006 | Adibhatla et al. |
| 7,197,430 | B2 | 3/2007 | Jacques et al. |

(Continued)

OTHER PUBLICATIONS

Enright, Michael P. et al., "Application of Probabilistic Fracture Mechanics to Prognosis of Aircraft Engine Components", Feb. 2006, AIAA Journal, vol. 44, No. 2, American Institute of Aeronautics and Astronautics, Inc. (Year: 2006).*

(Continued)

*Primary Examiner* — Cedric Johnson
(74) *Attorney, Agent, or Firm* — Wood IP LLC

(57) ABSTRACT

Systems and methods for predicting usage based lifing and low cycle fatigue consumption are provided. In one example embodiment, a method can include obtaining historical flight data associated with one or more gas turbine engines of an aerial vehicle; obtaining data indicative of one or more operational conditions of the aerial vehicle during an operating period; determining whether the flight data is indicative of a usable flight; and constructing a model correlating low cycle fatigue consumption with flight data using a machine learning technique.

20 Claims, 8 Drawing Sheets

(56) References Cited

U.S. PATENT DOCUMENTS

| | | |
|---|---|---|
| 7,328,128 B2 | 2/2008 | Bonanni et al. |
| 7,387,030 B1 | 6/2008 | deLaneuville |
| 7,505,844 B2 | 3/2009 | Wiseman et al. |
| 9,512,736 B2 | 12/2016 | Gendrich |
| 9,557,210 B2 | 1/2017 | Rao |
| 2010/0153080 A1 | 6/2010 | Khan et al. |
| 2014/0229149 A1 | 8/2014 | Guan et al. |
| 2015/0219539 A1 | 8/2015 | Mary et al. |
| 2018/0301040 A1* | 10/2018 | Waltner ............ G06Q 10/06315 |

OTHER PUBLICATIONS

Grelotti, Robert A. et al., "Usage Based Life Prediction Uncertainty Assessments and Fleet Management Impact for Gas Turbine Engines", Apr. 12-15, 2010, AIAA/ASME/ASCE/AHS/ASC Structures, Structural Dynamics, and Material Conference, American Institute of Aeronautics and Astronautics, Inc. (Year: 2010).*

Knight, P. et al., "Intelligent Management of Helicopter Health and Usage Management Systems Data", Sep. 14, 2005, Proc. IMechE vol. 219 Part G: J. Aerospace Engineering. (Year: 2005).*

Naeem, M. et al., "Consequences of Aero-Engine Deteriorations for Military Aircraft", 2001, Applied Energy 70, Elsevier, Science Ltd. (Year: 2001).*

Pfoertner, H. et al., "Statistical Correlations for Analysis and Prediction of Turbine Engine Component Life Usage", Jul. 8-11, 2001, 37th AIAA/ASME/SAE/ASEE Joint Propulsion Conference and Exhibit, American Institute of Aeronautics and Astronautics, Inc. (Year: 2001).*

* cited by examiner

USAGE BASED LIFING

FIELD

The present subject matter relates generally to digital systems for predicting cyclic life consumption of machinery components, such as components of gas turbine engines.

BACKGROUND

Material fatigue is a common phenomenon where structures fail when subjected to a cyclic load. Material fatigue can impact the lifespan, availability, reliability and safety of operation of machinery, such as gas turbine engines (GTE). Material fatigue can result in damage to and eventually the failure of machinery components.

In engine structural life computations, it is common to designate a lifespan for certain components based on a certain number of start-stop cycles and based on a standard flight or missions. This lifespan designation is often done during the design process and involves detailed calculations of stresses and temperatures for a standard flight, and the use of material property and fatigue models. The limitation of the design phase calculations and life span designations are that they cannot take into account actual operating conditions. This limitation can result in conservative life span estimates and subsequent change of remaining engine life span or engine damage due to different operation or operational conditions that were not considered during design.

Some existing methods for determining fatigue life consumption adopt a physics-based approach that is comparable to the design phase lifespan designation. The physics-based approach can be computationally intensive and involves relying on a representative set of operating periods or field missions to evaluate fatigue life limits of machinery components. Analogous to the design phase lifespan designation, these existing methods may not be ideal for near real-time or real-time application and do not include characteristics to account for actual operating conditions, such as flight data or engine performance, which can be considered and used to extend availability, reliability, and safety of operation of GTEs.

BRIEF DESCRIPTION

Aspects and advantages of embodiments of the present disclosure will be set forth in part in the following description, or may be learned from the description, or may be learned through practice of the embodiments.

One example aspect of the present disclosure is directed to a method for constructing a model correlating low cycle fatigue consumption with flight data. The method includes obtaining, by one or more computing devices, historical flight data indicative of one or more operational conditions of an aerial vehicle. The method further includes obtaining, by one or more computing devices, flight data indicative of one or more operational conditions of an aerial vehicle during an operating period. The method further includes determining, by one or more computing devices, whether the flight data is indicative of a usable flight. In response to determining that the flight data is indicative of a usable flight, the method further includes constructing a model, based at least in part on historical data, correlating low cycle fatigue consumption with the flight data using a machine learning technique.

Another example aspect of the present disclosure is directed to a system for modeling usage based life consumption of a gas turbine engine. The system includes one or more memory devices and one or more processors. The one or more memory devices store instructions and data. The one or more processors can execute the instructions and cause the one or more processors to perform operations that include obtaining historical data indicative of operational conditions of the gas turbine engine. The operations further include obtaining flight data indicative of one or more operational conditions of an aerial vehicle during an operating period. The operations further including determining whether the flight data is indicative of a usable flight. The operations further include generating a predicted usage based life (UBL) for one or more components of the gas turbine engine based on the historical data and the flight data using a machine learning technique. The operations further include determining a UBL Equivalent Cycle for the one or more components of the gas turbine engine based at least in part on a predetermined life factor and a predetermined life limit. The operations further include storing the determined UBL Equivalent Cycle in the memory device.

Another example aspect of the present disclosure is directed to a computer-implemented method for predicting usage based life of one or more components of a gas turbine engine. The method includes obtaining, by one or more computing devices, historical data indicative of operational conditions of one or more gas turbine engines of an aerial vehicle. The method further includes obtaining, by one or more computing devices, flight data indicative of operational conditions of an aerial vehicle during an operating period. The method further includes operation a non-physics based model, based at least in part on historical data, correlating flight data with usage based life of one or more components of the gas turbine engine. The method further includes determining the remaining usage based life of the one or more components based at least in part on the model and the flight data.

Variations and modifications can be made to these example embodiments of the present disclosure.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1A:
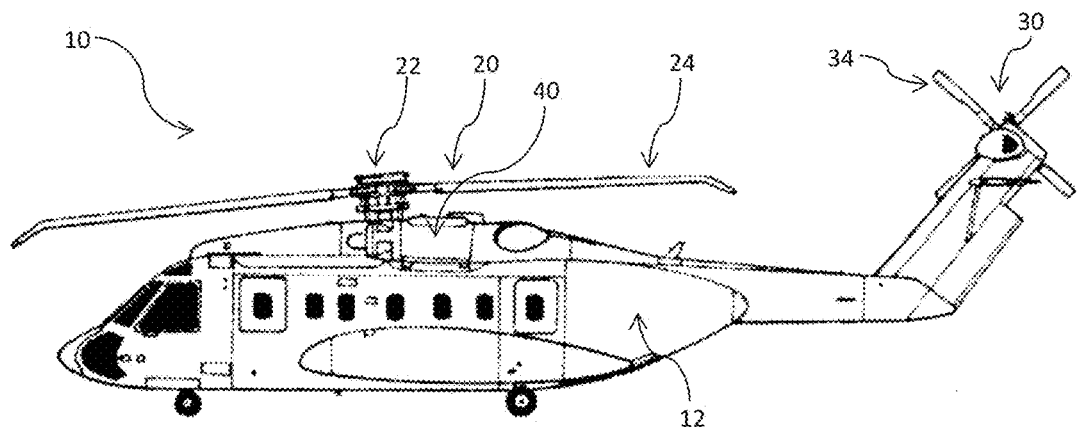
FIG. 1A depicts a profile view of an aerial vehicle in accordance with one embodiment of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

As used in the specification and the appended claims, the singular forms "a," "an," and "the" include plural referents unless the context clearly dictates otherwise. The use of the term "about" in conjunction with a numerical value refers to within 25% of the stated amount.

Low Cycle Fatigue (LCF) is one example of material fatigue that can impact the life span, availability, reliability and safety of operation of machinery, such as gas turbine engines. LCF can result in damage and eventually the failure of machinery components.

GTEs include rotating limited-life parts (LLPs). The life span of a LLP is related, at least in part, to damage that can be caused by LCF during each start-stop cycle or operating period of the GTE or during each mission flown by the aerial vehicle. During each start-stop cycle or operating period, a portion of the life span of each LLP is consumed as a result of low cycle fatigue. By tracking LCF life consumption, the amount of damage accumulated by LLPs during each start-stop cycle, operating period or mission can be determined.

LCF life consumption is based, at least in part, on actual operating conditions, such as rates of acceleration and deceleration, operating ambient temperature, operating time at certain engine temperatures and operating time at certain engine core speeds. LCF life consumption can be utilized in determining the remaining usage based life (UBL) of each component of a gas turbine engine. LCF life consumption can be used in determining the time at which a gas turbine engine should be serviced or removed from an aerial vehicle for replacement.

Accurate tracking and determination of LCF life consumption can allow for the determination of the remaining UBL, in near real-time or real-time. The near real-time or real-time remaining UBL can be used in defining and extending service or replacement intervals for a particular GTE. Extending service or replacement intervals can occur based on remaining UBL or LCF life consumption if an aerial vehicle is operated less aggressively than a standard mission. This allows the operator an opportunity to keep engine components on wing for a longer period of time and reduce waste of engine life span. Extension of service or replacement intervals is thus made possible by using actual flight data and actual engine performance data to determine LCF life consumption for a flight, mission or engine operating period and determining remaining UBL.

The near real-time or real-time remaining UBL can also be employed to accelerate a service or replacement schedule for a GTE when an aerial vehicle is operated more aggressively than a standard mission. In this situation, LCF life consumption and the determination of the remaining UBL can be used to more timely perform service or replacement activities and reduce the possibility of catastrophic engine damage due to aggressive operational conditions beyond a standard mission.

Example aspects of the present disclosure are directed to systems and methods for determining LCF life consumption, prediction of UBL consumption and determining remaining UBL. Aspects of the present disclosure will be discussed with reference to LCF life consumption of a particular component (e.g., a rotor shaft) of a gas turbine engine used for aviation (e.g., to provide propulsion for an aircraft). However, those of ordinary skill in the art, using the disclosures provided herein, will understand that aspects of the present disclosure can be used to determine LCF life consumption, predict UBL consumption and determine remaining UBL in a variety of applications, such as wind turbines, jet engines, turboprop engines, aeroderivative gas turbines, amateur gas turbines, auxiliary power units, gas turbines for power generation, turboshaft engines, radial gas turbines, scale jet engines, microturbines, or other applications. Those of ordinary skill in the art, using the disclosures provided herein, will also understand that aspects of the present disclosure can be used to determine LCF life consumption, predict UBL consumption and determine remaining UBL in a variety of vehicles, such as locomotives, ships, fixed wing aircraft, wind turbines or land based pumps, including gas and oil pumps.

According to example embodiments, data recorded by one or more monitoring system(s) configured to monitor parameters of a gas turbine engine of an aerial vehicle during flight ("e.g., flight data") can be collected. The flight data can include parameters such as core speed, turbine gas temperature, turbine gas temperature margin, torque, outside air temperature, gross weight, altitude corrected pressure, vertical acceleration, air speed and collective position associated with the gas turbine engine and aerial vehicle. The flight data can be high-frequency sensory data collected by an on-board flight recorder. Machine learning techniques can be used to construct one or more models mapping the flight data to LCF life consumption or remaining UBL. The one or more models can each be non-physics based models. The model(s) can be used to predict LCF life consumption for LLPs, such as rotors or rotor shafts of gas turbine engines, based on actual usage.

Example aspects of the present disclosure can provide a number of technical effects and benefits. For instance, use of machine learning techniques to construct model(s) mapping flight data to LCF life consumption can bypass complex calculations used in physics-based model computations, such as calculating complex thermo-mechanical parameters. The model(s) can allow for processing and storage resources to be used for other functions. Moreover, the model constructed according to example aspects of the present disclosure can be an analytical model that can allow for almost instantaneous prediction of LCF life consumption or remaining UBL based on actual usage. The analytical model can provide accurate near real-time or real-time LCF life consumption or remaining UBL. Benefits of predicting LCF life consumption using a model constructed according to example embodiments of the present disclosure can include: (1) setting safe and appropriate intervals for component removal and repair; (2) prolonging the functioning time of assets; and (3) optimizing asset operation and its correlation to field issues.

Example aspects of the present disclosure can provide an improvement in computing technology. For instance, the use of machine learning instead of physics based computations can provide for the development of models that are easier to evaluate relative to physics-based models for the prediction of LCF life consumption or remaining UBL. This can save processing and storage resources of a computing system. The model(s) can also provide for the faster processing and prediction of LCF life consumption and remaining UBL.

FIG. 1A depicts a profile view of an exemplary aerial vehicle 10 in accordance with the present disclosure. The aerial vehicle 10 includes an airframe 12, a main rotor assembly 20, and a tail rotor assembly 30. The main rotor assembly 20 includes a main rotor hub 22 and a plurality of main rotor blades 24. As shown, each main rotor blade 24 extends outward from the central rotor hub 22. The tail rotor section 30 includes a tail rotor hub 32 and a plurality of tail rotor blades 34. Each tail rotor blade 34 extends outward from the tail rotor hub 32.

Figure 1B:
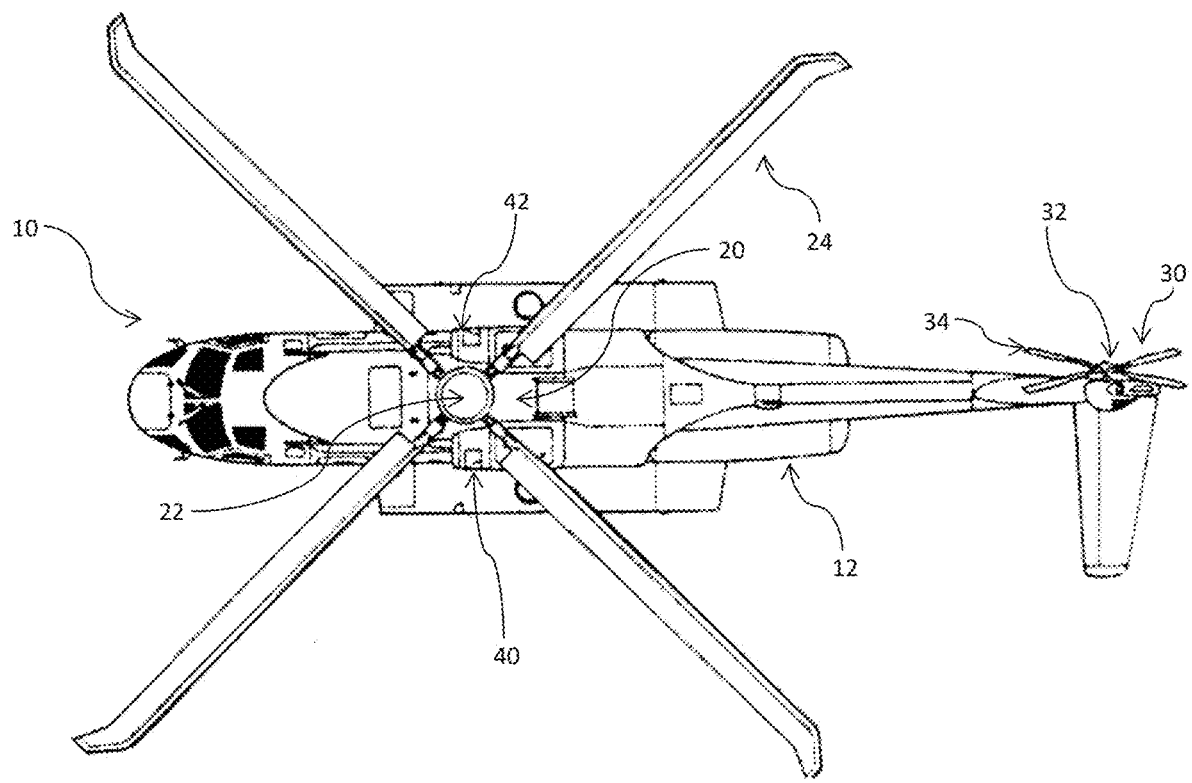
FIG. 1B depicts an overhead view of an aerial vehicle in accordance with one embodiment of the present disclosure.

FIG. 1B depicts an overhead view of an exemplary aircraft 10 in accordance with the present disclosure. The aerial vehicle 10 further includes a first gas turbine engine 40 and a second gas turbine engine 42. The first and second gas turbine engines 40, 42 generate and transmit torque to drive rotation of the main rotor blades 24 and the tail rotor blades 34. In particular, rotation of the main rotor blades 24 generates lift for the aerial vehicle 10, while rotation of the tail rotor blades 34 generates thrust and counteracts torque exerted on the airframe 12 by the main rotor blades 24.

The first and second gas turbine engines 40, 42 can include sensors for sensing data related to the first and second gas turbine engines 40, 42. The aircraft 10 can include a computing device. The computing device can store the sensed data related to the first and second gas turbine engines 40, 42, along with other data related to operation of the aerial vehicle 10 (for example, data from a control unit), as flight data.

Figure 10:
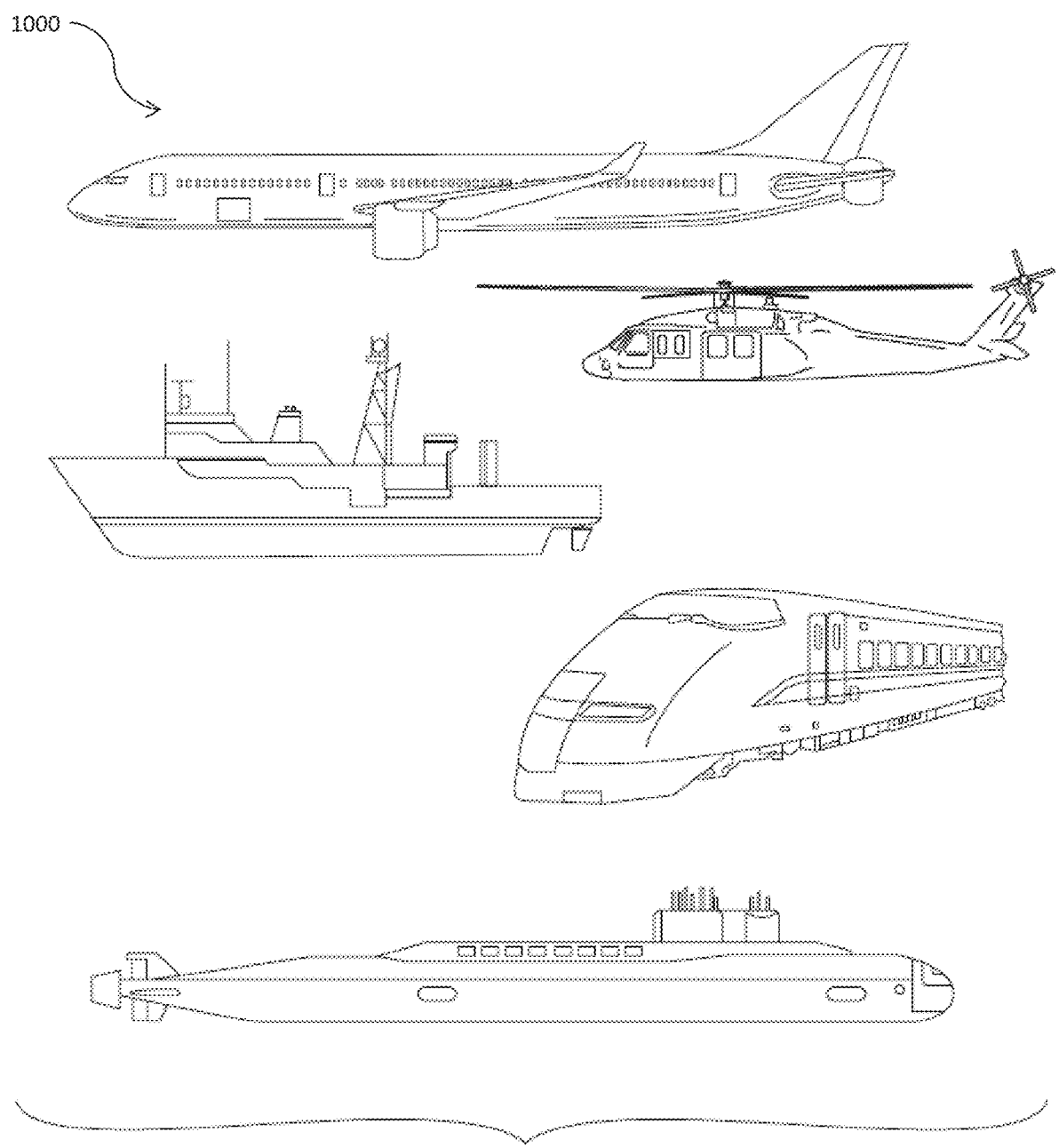
FIG. 10 depicts example vehicles according to example embodiments of the present disclosure.

In applications related to certain vehicles, such as those shown in FIG. 10, the vehicle can include a communication interface for communicating with a ground system and/or a cloud computing environment. In applications related to certain vehicles, such as those shown in FIG. 10, the vehicle can transmit information, such as the flight data, to the ground system and/or the cloud computing environment via the communication interface. In applications related to certain vehicles, such as those shown in FIG. 10, the vehicle can receive information from the ground system and/or the cloud computing environment via the communication interface.

It should be appreciated that, although a particular helicopter has been illustrated and described, other configurations and/or aircraft, such as high speed compound rotary-wing aircraft with supplemental translational thrust systems, dual contra-rotating, coaxial rotor system aircraft, turboprops, tilt-rotors, tilt-wing aircraft, conventional take-off and landing aircraft, the vehicles shown in FIG. 10 and other turbine driven machines will also benefit from the present disclosure.

Figure 2:
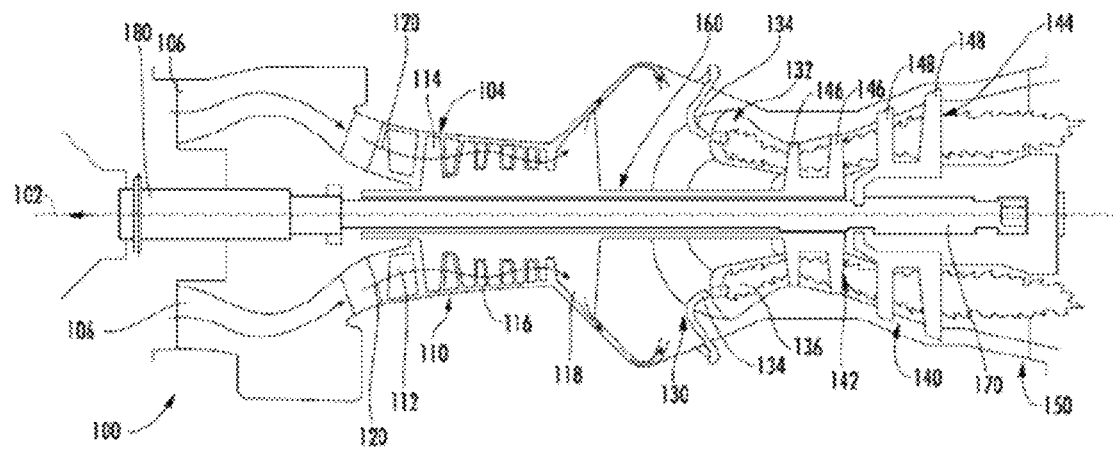
FIG. 2 is a schematic cross-sectional view of a gas turbine engine in accordance with one embodiment of the present disclosure.

FIG. 2 provides a schematic cross-sectional view of an exemplary gas turbine engine 100 in accordance with the present disclosure. As shown in FIG. 2, the gas turbine engine 100 defines a longitudinal or centerline axis 102 extending therethrough for reference. The gas turbine engine 100 may generally include a substantially tubular outer casing 104 that defines an annular inlet 106. The outer casing 104 may be formed from a single casing or multiple casings. The outer casing 104 encloses, in serial flow relationship, a gas generator compressor 110, a combustion section 130, a turbine 140, and an exhaust section 150. The gas generator compressor 110 includes an annular array of inlet guide vanes 112, one or more sequential stages of compressor blades 114, one or more sequential stages of compressor vanes 116, and a centrifugal compressor 118. Collectively, the compressor blades 114, the compressor vanes 116, and the centrifugal compressor 118 define a compressed air path 120. The gas turbine engine 100 can include one or more sensors for sensing information related to the gas turbine engine 100.

The combustion section 130 includes a combustion chamber 132 and one or more fuel nozzles 134 extending into the combustion chamber 132. The fuel nozzles 134 supply fuel to mix with compressed air entering the combustion chamber 132. Further, the mixture of fuel and compressed air combust within the combustion chamber 132 to form combustion gases 136. As will be described below in more detail, the combustion gas 136 drives the turbine 140.

The turbine 140 includes a gas generator turbine 142 and a power turbine 144. The gas generator turbine 142 includes one or more sequential stages of turbine rotor blades 146, and the power turbine 144 includes one or more sequential stages of turbine rotor blades 148. The gas generator turbine 142 drives the gas generator compressor 110 via a gas generator shaft 160, and the power turbine 144 drives an output shaft 180 via a power turbine shaft 170.

As shown in the embodiment illustrated in FIG. 2, the gas generator compressor 110 and the gas generator turbine 142 are coupled to one another via the gas generator shaft 160. In operation, the combustion gases 136 drives both the gas generator turbine 142 and the power turbine 144. As the gas generator turbine 142 rotates around the centerline axis 102, the gas generator compressor 110 and the gas generator shaft 160 both rotate around the centerline axis 102. Further, as the power turbine 144 rotates, the power turbine shaft 170 rotates and transfers rotational energy to the output shaft 180. As an example, the gas turbine engine 100 may be the first and second gas turbine engines 40, 42 of FIGS. 1A and 1B, and the output shaft 180 may rotate both the main and tail rotor blades 24, 34 of the aerial vehicle 10.

Figure 3:
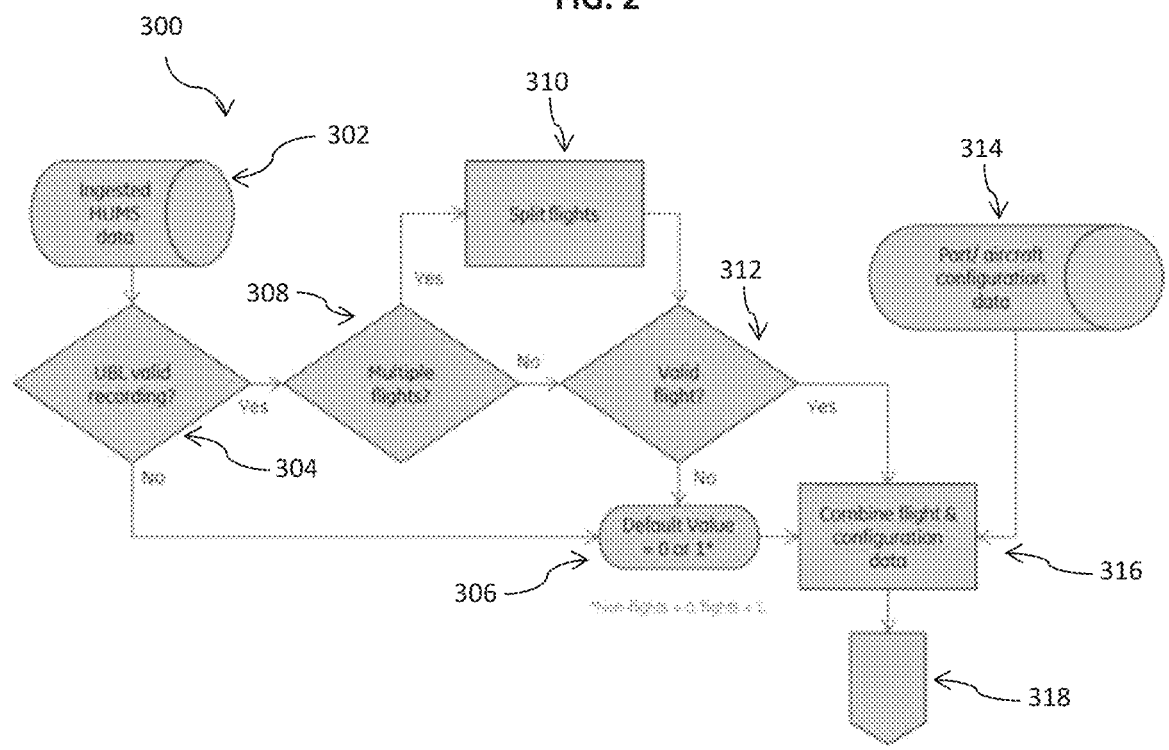
FIG. 3 depicts a flow diagram of an example method according to example embodiments of the present disclosure.
Figure 4:
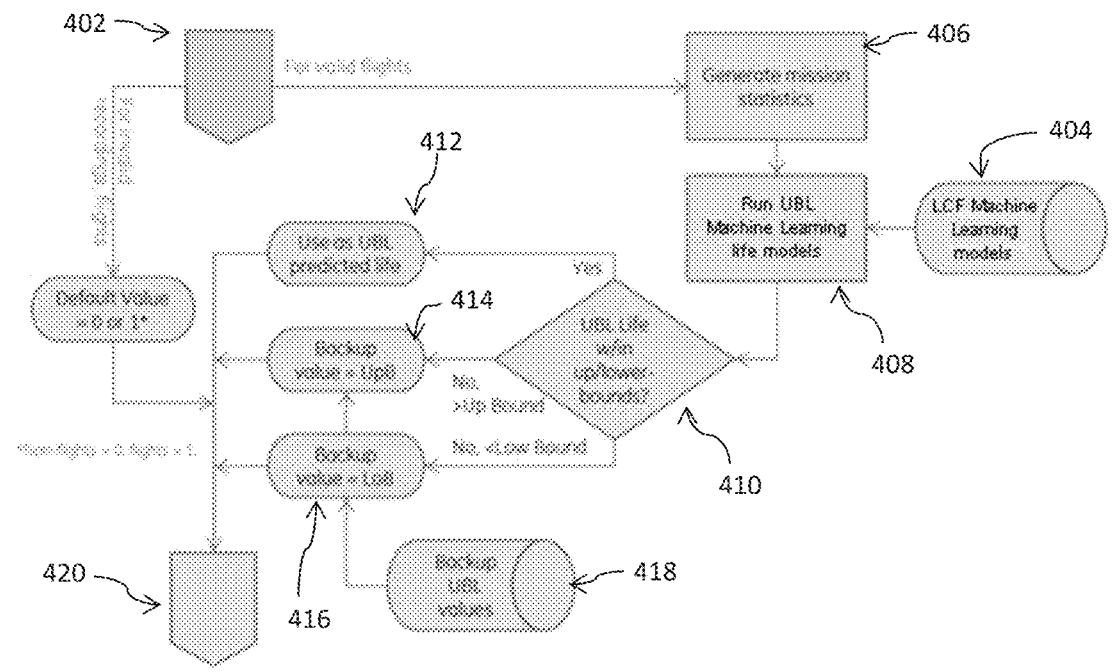
FIG. 4 depicts a continuation of a flow diagram of an example method according to example embodiments of the present disclosure.
Figure 5:
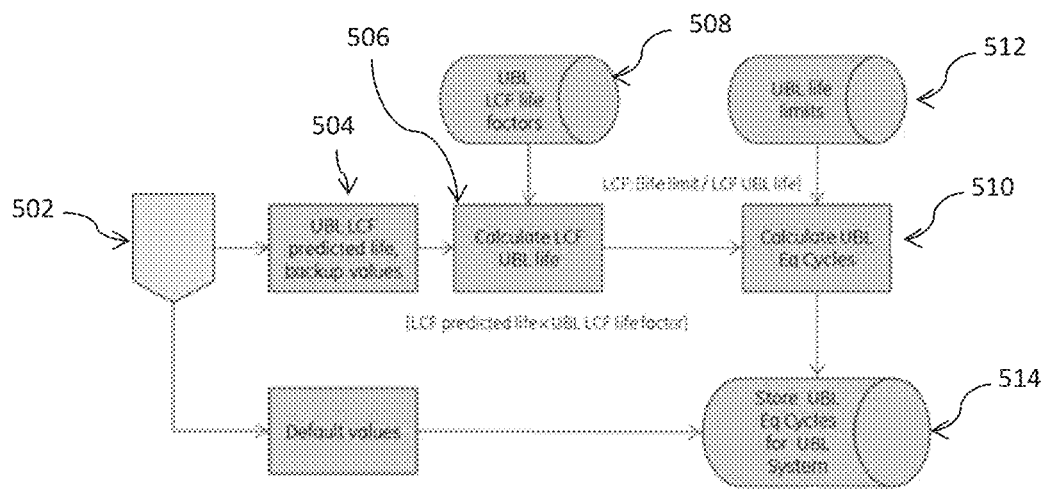
FIG. 5 depicts a continuation of a flow diagram of an example method according to example embodiments of the present disclosure.

FIGS. 3, 4 and 5 depict a flow diagram of an example method (300) for predicting UBL Equivalent Cycles for one or more components of a gas turbine engine according to example embodiments of the present disclosure. The method can be implemented by any suitable computing system, such as the computing system depicted in FIG. 9. In addition, although FIGS. 3, 4, and 5 depict steps performed in a particular order for purposes of illustration and discussion. Those of ordinary skill in the art, using the disclosures provided herein, will understand that various steps of any of the methods or processes disclosed herein can be adapted, expanded, performed simultaneous, omitted, and/or rearranged without deviating from the scope of the present disclosure.

At (302), the method includes recording sensor data for parameters that can affect LCF life consumption and UBL Equivalent Cycles. The sensor data can be engine flight data and can include parameters related to gas turbine engine operations. The parameters associated with engine flight data can include, for instance, core speed, turbine gas temperature, turbine gas temperature margin and torque. The sensor data can also be vehicle flight data and can include parameters related to aerial vehicle operations. The parameters associated with vehicle flight data can include, for instance, outside air temperature, gross weight, altitude corrected pressure, vertical acceleration, air speed and collective position associated with the aerial vehicle. In some embodiments, the sensor data can be data collected by a health and usage monitoring system (HUMS), that can include a comprehensive and continuous recording of parameters associated with actual gas turbine engine operations and actual aerial vehicle operations.

At (304), the method can also include determining whether the recording obtained at (302) is valid. A valid recording includes engine flight data and vehicle flight data. If the recording is determined at (304) as not valid, the method proceeds to (306). If the recording is valid, the method proceeds to (308).

At (306), the method can also include determining whether the recording obtained at (302) includes data indicative of a flight by the aerial vehicle. If it is determined that the aerial vehicle executed a flight, the UBL Equivalent Cycle value is adjusted to a default value of one (1) cycle count and is stored at (514) of FIG. 5. If it is determined that the aerial vehicle did not execute a flight, the UBL Equivalent Cycle value is adjusted to a default value of zero (0) cycle counts and is stored at (514) of FIG. 5.

At (308), the method can also include determining whether the recording obtained at (302) includes data associated with multiple flights by the aerial vehicle. If the recorded data is determined to be associated with multiple flights, the information is separated and categorized by flight at (310). If the recorded data is not associated with multiple flights, the method proceeds to (312).

At (312), the method includes determining whether the data recorded at (302) is indicative of a usable flight. Data is indicative of a usable flight when it is within one or more predetermined operating thresholds. The operating thresholds can include or relate to operating limits for the aerial vehicle or GTE. For example, the operating thresholds can be defined by a manufacturer or established by the aviation regulator. For example, the operating thresholds can relate to predetermined or near maximum air speeds, altitudes, torque or engine core speed. If it is determined that the data is not indicative of a usable flight, the method proceeds to (306) and the UBL Equivalent Cycle value is adjusted to a default value of one (1) cycle count and is stored at (514) of FIG. 5.

At (314), the method includes obtaining information to identify each LLP and GTE associated with the aerial vehicle. The identifying information can include the make, model and type of aerial vehicle or GTEs affixed thereto and the part number or serial number for each LLP of the aerial vehicle and GTE.

At (316), the method includes associating the identifying information obtained at (314) with the recorded flight data.

At (318) the method proceeds to (402) of FIG. 4.

Figure 6:
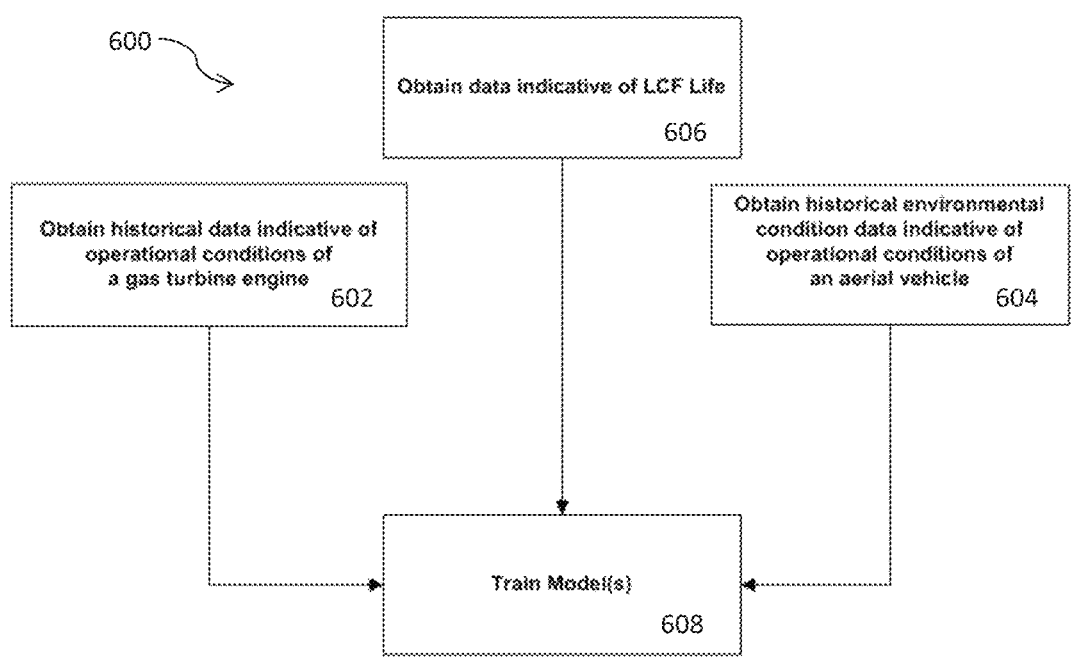
FIG. 6 depicts a flow diagram of an example method according to example embodiments of the present disclosure.
Figure 7:
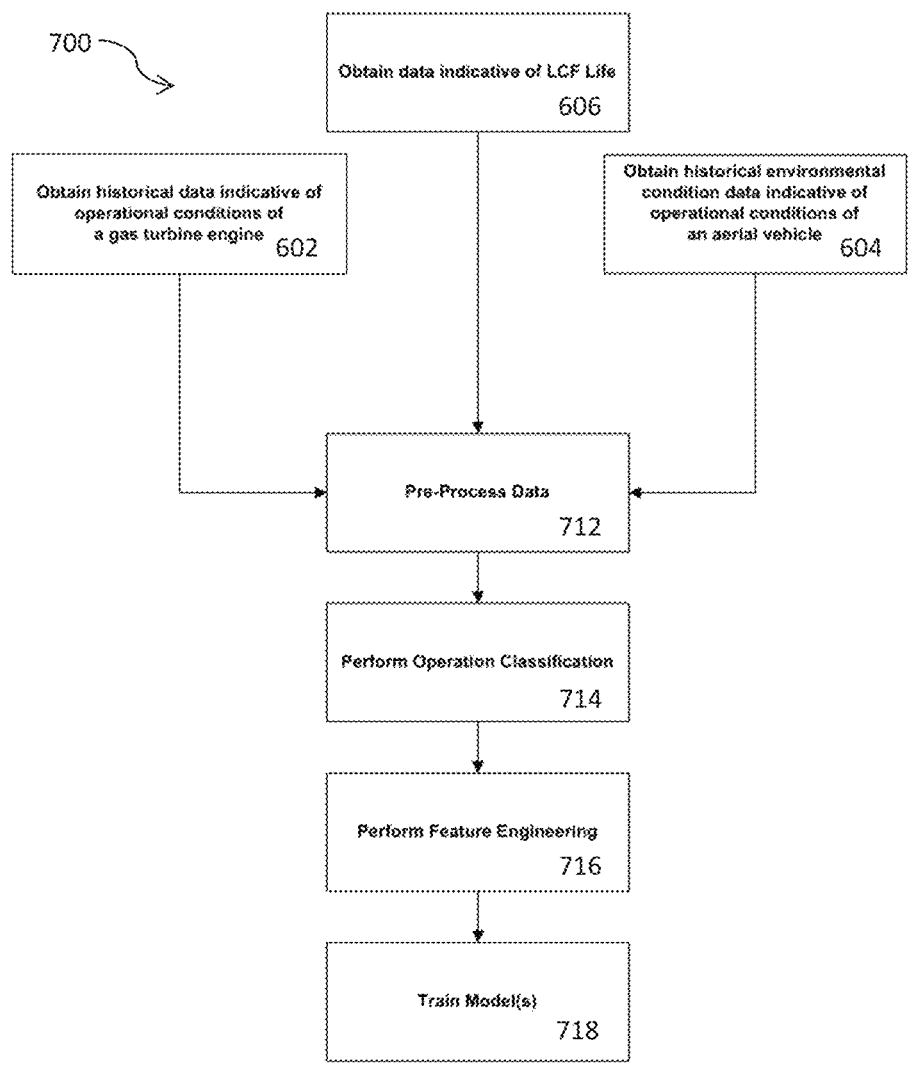
FIG. 7 depicts a flow diagram of an example method according to example embodiments of the present disclosure.

FIG. 4 is a continuation of the flow diagram of an example method (300) for predicting UBL Equivalent Cycles for one or more components of a gas turbine engine according to example embodiments of the present disclosure. At (404) the method includes training a model using machine learning according to example embodiments of the present disclosure. The model can be trained according to example embodiments of the present disclosure, including as depicted in FIGS. 6 and 7 and descriptions thereof.

At (406), the method includes generating mission or flight statistics which are processed by the model. Mission statistics can be identified based on the particular engine location or component where damage due to LCF has occurred. Mission statistics may be identified based on parameters that can include, for instance, core speed, turbine gas temperature, turbine gas temperature margin and torque, associated with the gas turbine engine and aerial vehicle.

At (408), the method includes applying the model to the mission statistics to obtain predicted UBL life for one or more components of the gas turbine engine.

At (410), the method includes comparing the predicted UBL life to a predetermined lower-bound limit and a predetermined upper-bound limit that is specific to each of the one or more components of the gas turbine engines. The upper-bound limit and lower-bound limit can be obtained through physics-based approaches with or without the use of flight data and may be based upon operating thresholds defined by manufacturer(s) of the GTE or the LLPs.

If it is determined at (410) that the predicted UBL life is within the upper-bound limit and the lower-bound limit, the predicted UBL life is used at (412) and delivered to (504). If it is determined at (410) that the predicted UBL life is greater than the upper-bound limit, the predicted UBL life is modified at (414) to equal a first backup UBL value stored at (418) and the first backup UBL value is delivered to (504). The first backup UBL value can be equivalent to the upper-bound limit of the GTE.

If it is determined at (410) that the predicted UBL life is less than the lower-bound limit, the predicted UBL life is modified at (416) to equal a second backup UBL value stored at (418) and the second backup UBL value is delivered to (504). The second backup UBL value can be equivalent to the lower-bound limit of the GTE.

At (420) the method proceeds to (502) of FIG. 5.

FIG. 5 is a continuation of the flow diagram of an example method (300) for predicting UBL Equivalent Cycles for one or more components of a gas turbine engine according to example embodiments of the present disclosure. At (506) the method includes calculating the LCF UBL life by multiplying the UBL value delivered to (504) by a UBL LCF life factor (508). The UBL LCF life factor (508) is a predetermined value and is based upon the percentage of the total life span of a particular component or LLP that can be consumed before service or replacement of the component or LLP is required.

At (510) the method includes calculating the UBL Equivalent Cycles by dividing a UBL life limit (512) by the LCF UBL life determined at (506). The UBL life limit (512) is a predetermined value and is based upon a percentage of the total life span of a particular component or LLP that can be consumed before service or replacement of the component or LLP is required. The UBL Equivalent Cycles calculated at (510) represent the cyclic life consumed per component or LLP, per flight or operating period.

FIG. 6 depicts a flow diagram of an example method (600) for constructing a LCF life consumption prediction model according to example embodiments of the present disclosure. The method can be implemented by any suitable computing system, such as the computing system depicted in FIG. 9. In addition, although FIG. 6 depicts steps performed in a particular order for purposes of illustration and discussion. Those of ordinary skill in the art, using the disclosures provided herein, will understand that various steps of any of the methods or processes disclosed herein can be adapted, expanded, performed simultaneous, omitted, and/or rearranged without deviating from the scope of the present disclosure.

At (602), the method includes obtaining historical sensor data for parameters that can affect LCF life consumption. The historical sensor data can be flight data and can include parameters related to GTE operations. In some embodiments, the sensor data can be data collected by a health and usage monitoring system (HUMS), that can include a comprehensive and continuous recording of parameters associated with actual GTE operation. The parameters can include, for instance, core speed, turbine gas temperature, turbine gas temperature margin and torque, associated with the gas turbine engine and aerial vehicle.

At (604), the method can also include obtaining historical environmental condition data. The historical environmental condition data can include data associated with the environment in which the gas turbine engine operates and the manner in which the aerial vehicle operates. Examples, include outside air temperature, gross weight, altitude corrected pressure, vertical acceleration, air speed and collective position associated with the gas turbine engine and aerial vehicle.

At (606), the method can include obtaining data indicative of actual LCF life consumption. This can be used to determine ground truth for training the model. The data indicative of actual LCF life consumption can be obtained in a variety of manners. For instance, the data can be obtained through LCF analysis technics. The data can obtained through other physics-based approaches with or without the use of flight data.

At (608), machine learning techniques can be used to train the model based on the data indicative of actual LCF life consumption and the flight data. Environmental data can be considered in some embodiments in training the model. Any suitable type of model can be constructed according to example embodiments of the present disclosure. For instance, a random forest model ("RF model") and/or a neural network model ("NN model") can be constructed. In some embodiments, non-linear regression with or without regularization can be used. In some embodiments, one or more of gradient boost machine, artificial neural network, self-organizing maps, and/or deep learning can be used. In some embodiments, a RF regression model of LCF life consumption can be constructed.

FIG. 7 depicts a flow diagram of an example method (700) for training a model using machine learning according to example embodiments of the present disclosure. As discussed above, the model can be trained by obtaining flight data (602), obtaining data indicative of actual LCF life consumption (606), and/or by obtaining environmental condition data (604).

At (712), the method can include pre-processing the data. For instance, the raw flight data can be processed to identify quality issues caused by malfunctioning sensors, incomplete or duplicate data ingestion, incorrect data type conversion through transfer or storage.

At (714), the method can include performing operation classification. For instance, operations can be classified based on the pre-processed flight data. Operations that are suitable for machine learning model development can be identified.

At (716), the method can include feature engineering to determine appropriate features based on the flight data for training the model(s). Example features are discussed in detail below.

In some embodiments, dwell time features are determined. Dwell time features can include the duration of a flight while selected engine parameters remain with certain ranges specified by upper and lower bounds. Selected engine parameters can include, for instance, temperature at various locations, core engine speed or acceleration. Upper and lower bounds can be determined for individual engines separately or various engines collectively.

In some embodiments, time-at-value and time-above-value features are determined. For instance, time-at-value and time-above-value features can include the duration of flight while selected engine parameters remain at or above selected lower bounds. Selected engine parameters can include temperature at various locations or core engine speed. Lower bounds can be extracted from individual engines separately or various engines collectively.

In some embodiments, rolling window features can be determined. Rolling window features can include, for instance, statistical aggregated values, or their combinations, of selected engine parameters during a rolling window of selected lengths. Statistical aggregation functions can include mean, median, maximum, minimum, standard deviation, interquartile range, sum, product, counts of pre-selected values, cumulative values of all forgoing functions, logarithmic transformation of all forgoing functions, etc. Combinations can include product, division, subtraction, sum, exponential power of another feature, etc. For certain features that are combined, non-uniform rolling window lengths may or may not be used. Selected engine parameters include but not limited to temperature at various location and core engine speed or torque. Depending on the sampling interval, rolling window lengths vary from 1 sampling interval to maximum length among known flights.

In some embodiments, counts of known operation cycles related to fatigue can be determined. Certain operation cycles, defined as a complete cycle moving from one engine speed band (dictated by an upper and a lower threshold) to another speed band, and then return to the original engine speed band, are known factors that impact LCF life consumption. Counts of such operation cycles can be used as input features.

In some embodiments, cumulative features across different flights executed by the same engine can be determined. All features above can be extracted from individual flights. However, one particular engine may execute thousands of flights in its life span. The cumulative effect of all above features across different missions can therefore also be used as input features.

In some embodiments, feature optimization can be performed. Feature groups can be identified based on similarity. During the model training, important features can be identified based on the particular engine location or LLP where damage due to LCF has occurred, where damage due to LCF is increasing or where LCF life consumption is highest. These important features are then used as the optimized features for machine learning models. Important features may also be identified based on individual engines.

At (718), the method can include training, tuning, and cross-validating the one or more models. In some embodiments, the one or more models can map the input features to LCF life consumption or other dependent variables for each cycle.

Figure 8:
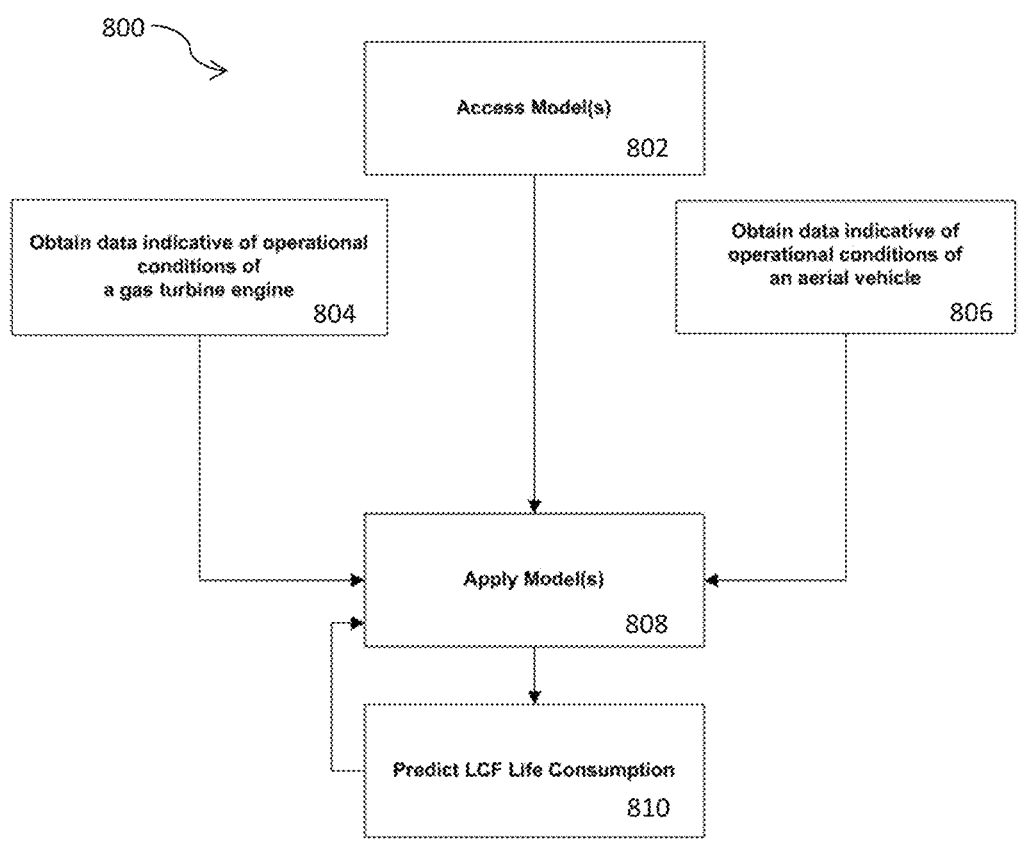
FIG. 8 depicts a flow diagram of an example method according to example embodiments of the present disclosure.

FIG. 8 depicts a flow diagram of an example method (800) of using a model constructed according to example aspects of the present disclosure to predict LCF life consumption based on flight data in real-time or near-real time. The method (800) can be implemented by any suitable computing system, such as the computing system depicted in FIG. 9. In addition, although FIG. 8 depicts steps performed in a particular order for purposes of illustration and discussion. Those of ordinary skill in the art, using the disclosures provided herein, will understand that various steps of any of the methods or processes disclosed herein can be adapted, expanded, performed simultaneous, omitted, and/or rearranged without deviating from the scope of the present disclosure.

At (802), the method can include accessing the model. The model can be previously trained using machine learning techniques as discussed above. The model can correlate flight data with LCF life consumption. The method can include obtaining sensor data (e.g., flight data) (804) and/or data indicative of operational conditions of an aerial vehicle (806). The data indicative of operational conditions of an aerial vehicle can include data associated with the environment in which the aerial vehicle operates and the manner in which the aerial vehicle operates. Examples, include outside air temperature, gross weight, altitude corrected pressure, vertical acceleration, air speed and collective position associated with the gas turbine engine and aerial vehicle. Based on the data, the model can be applied (808) to obtain predicted LCF life consumption (810). The flight data used to determine predicted LCF life consumption (810) can be fed back to the model for use in prediction of LCF life consumption in the next cycle.

Figure 9:
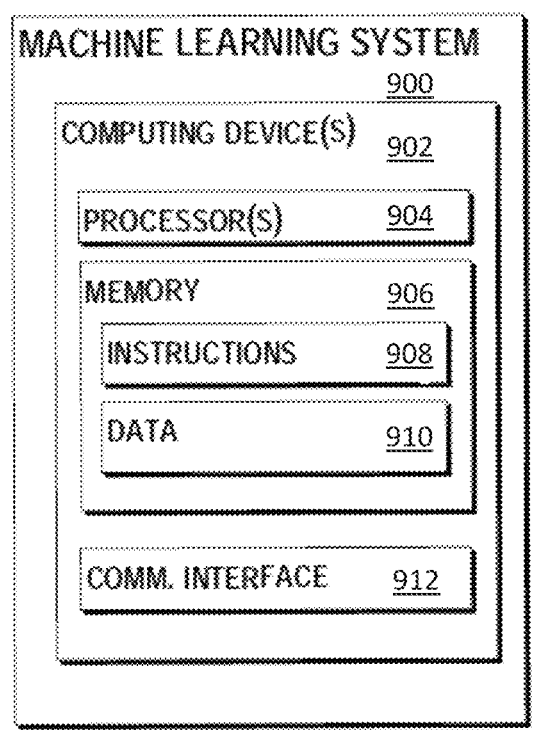
FIG. 9 depicts an example computing system according to example embodiments of the present disclosure.

FIG. 9 depicts a block diagram of an example computing system that can be used to implement the machine learning system 900 according to example embodiments of the present disclosure. The machine learning system 900 can be implemented on one or more cloud computing environments, one or more ground systems, or a combination of the foregoing. As shown, the machine learning system 900 can include one or more computing device(s) 902. The one or more computing device(s) 902 can include one or more processor(s) 904 and one or more memory device(s) 906. The one or more processor(s) 904 can include any suitable processing device, such as a microprocessor, microcontroller, integrated circuit, logic device, or other suitable processing device. The one or more memory device(s) 906 can include one or more computer-readable media, including, but not limited to, non-transitory computer-readable media, RAM, ROM, hard drives, flash drives, or other memory devices.

The one or more memory device(s) 906 can store information accessible by the one or more processor(s) 904, including computer-readable instructions 908 that can be executed by the one or more processor(s) 904. The instructions 908 can be any set of instructions that when executed by the one or more processor(s) 904, cause the one or more processor(s) 904 to perform operations. The instructions 908 can be software written in any suitable programming language or can be implemented in hardware. In some embodiments, the instructions 908 can be executed by the one or more processor(s) 904 to cause the one or more processor(s) 904 to perform operations, such as the operations for modeling LCF consumption, usage based life consumption and remaining useful life of LLPs and/or any other operations or functions of the one or more computing device(s) 902.

The memory device(s) 906 can further store data 910 that can be accessed by the processors 904. For example, the data 910 can include historical flight and engine performance data associated with the type or model of the one or more GTEs of an aerial vehicle 10. The data 910 can also include actual flight data and actual engine performance data for one or more GTEs associated with one or more operating periods of the GTEs or associated with each mission flown by the aerial vehicle 10. The actual flight data and actual engine performance data can include core speed, turbine gas temperature, turbine gas temperature margin, torque, outside air temperature, gross weight, altitude corrected pressure, vertical acceleration, air speed and collective position. The actual flight data and actual engine performance data can include navigational information, data associated with the vehicle controls or control mechanisms, data associated with geographic coordinates, and/or any other data associated with vehicles, as described herein. The data 910 can include one or more table(s), function(s), algorithm(s), model(s) and equation(s) for modeling LCF consumption according to example embodiments of the present disclosure.

The one or more computing device(s) 902 can also include a communication interface 912 used to communicate, for example, with the other components of system. The communication interface 912 can include any suitable components for interfacing with one or more network(s), including for example, transmitters, receivers, ports, controllers, antennas, or other suitable components. The communication interface 912 can enable communication between the one or more cloud computing environments and the one or more ground systems, between the one or more cloud computing environments and the vehicle, such as those depicted in FIG. 10, and between the one or more ground systems and the vehicle. Additionally, the communication interface 912 can enable communication between two or more cloud computing environments, between two or more ground systems, and between two or more vehicles.

Referring now to FIG. 10, example vehicles 1000 according to example embodiments of the present disclosure are depicted. The systems and methods of the present disclosure can be implemented on an aircraft, helicopter, boat, submarine, train, and/or any other suitable vehicles. While the present disclosure is described herein with reference to an aircraft implementation, this is intended only to serve as an example and not to be limiting. One of ordinary skill in the art would understand that the systems and methods of the present disclosure can be implemented on other vehicles without deviating from the scope of the present disclosure.

The technology discussed herein makes reference to computer-based systems and actions taken by and information sent to and from computer-based systems. One of ordinary skill in the art will recognize that the inherent flexibility of computer-based systems allows for a great variety of possible configurations, combinations, and divisions of tasks and functionality between and among components. For instance, processes discussed herein can be implemented using a single computing device or multiple computing devices working in combination. Databases, memory, instructions, and applications can be implemented on a single system or distributed across multiple systems. Distributed components can operate sequentially or in parallel.

Although specific features of various embodiments may be shown in some drawings and not in others, this is for convenience only. In accordance with the principles of the present disclosure, any feature of a drawing may be referenced and/or claimed in combination with any feature of any other drawing.

This written description uses examples to disclose the present disclosure, including the best mode, and also to enable any person skilled in the art to practice the present disclosure, including making and using any devices or systems and performing any incorporated methods. The patentable scope of the present disclosure is defined by the claims, and can include other examples that occur to those skilled in the art. Such other examples are intended to be within the scope of the claims if they include structural elements that do not differ from the literal language of the claims, or if they include equivalent structural elements with insubstantial differences from the literal language of the claims.

What is claimed is:

1. A method for constructing a model correlating low cycle fatigue consumption with flight data, the method comprising:
   obtaining, by one or more computing devices, historical data indicative of one or more operational conditions of an aerial vehicle;
   obtaining, by the one or more computing devices, flight data indicative of one or more operational conditions of the aerial vehicle during an operating period;
   determining, by the one or more computing devices, whether the flight data is indicative of a usable flight; and
   in response to determining that the flight data is indicative of a usable flight, constructing, by the one or more computing devices, a model, based at least in part on historical data and the flight data, correlating low cycle fatigue consumption with the flight data using a machine learning technique.

2. The method of claim 1, wherein the flight data is obtained by one or more sensors associated with a health and usage monitoring system.

3. The method of claim 2, wherein the flight data comprises:
   engine flight data, wherein the engine flight data is indicative of one or more operational conditions of one or more gas turbine engines of an aerial vehicle during the operating period; and
   vehicle flight data, wherein the vehicle flight data is indicative of one or more operational conditions the aerial vehicle during the operating period.

4. The method of claim 3, further comprising determining a predicted usage based life (UBL) for one or more components of the gas turbine engines based at least in part on the model.

5. The method of claim 4, wherein determining whether the flight data is indicative of a usable flight comprises:
   determining whether the flight data includes engine flight data and vehicle flight data.

6. The method of claim 5, wherein the components of the gas turbine engines comprise rotating life limited parts.

7. The method of claim 6, wherein during determining, it is determined that the flight data is not indicative of a usable flight, the method further comprises:
   adjusting the predicted UBL to a first default value; and
   storing the first default value as a UBL Equivalent Cycle in a memory.

8. The method of claim 6, further comprising:
   determining whether the predicted UBL is within an upper threshold and a lower threshold; and
   in response to determining that the predicted UBL in not within the upper threshold and the lower threshold, adjusting the predicted UBL to a second default value.

9. The method of claim 8, further comprising:
   determining a UBL Equivalent Cycle for the one or more components of the gas turbine engine, based at least in part on a predetermined life factor and a predetermined life limit; and
   storing the determined UBL Equivalent Cycle in a memory.

10. The method of claim 9, further comprising:
    determining maintenance requirements for one or more components of the gas turbine engine based at least in part on the UBL Equivalent Cycle.

11. The method of claim 2, wherein the model comprises a random forest model.

12. The method of claim 11, wherein the flight data is processed to determine one or more feature inputs for training the model.

13. The method of claim 12, wherein the one or more feature inputs comprise a time-at-value feature.

14. The method of claim 13, wherein the one or more feature inputs comprise a time-above-value feature.

15. A system for modeling usage based life consumption of a gas turbine engine comprising:
    one or more memory devices;
    one or more processors configured to:
      obtain historical data indicative of operational conditions of the gas turbine engine;
      obtain, flight data indicative of one or more operational conditions of an aerial vehicle during an operating period;
      determine, whether the flight data is indicative of a usable flight;
      generate a predicted usage based life (UBL) for one or more components of the gas turbine engine based on the historical data and the flight data using a machine learning technique;
      determine a UBL Equivalent Cycle for the one or more components of the gas turbine engine based at least in part on a predetermined life factor and a predetermined life limit; and
      store the determined UBL Equivalent Cycle in the memory device.

16. The system of claim 15, wherein the one or more processors are configured to:
    generate one or more feature inputs, based on the flight data, for use with the machine learning technique.

17. The system of claim 16, wherein the machine learning technique is implemented at least in part by a random forest model.

18. The system of claim 17, wherein the one or more feature inputs comprise a time-at-value feature.

19. The system of claim 18, wherein the one or more feature inputs comprise a time-above-value feature.

20. A computer-implemented method for predicting usage based life of one or more components of a gas turbine engine, the method comprising:
    obtaining, by one or more computing devices, historical data indicative of operational conditions of one or more gas turbine engines of an aerial vehicle;
    obtaining, by the one or more computing devices, flight data indicative of operational conditions of the aerial vehicle during an operating period;
    determining, by the one or more computing devices, whether the flight data is indicative of a usable flight;
    in response to determining that the flight data is indicative of a usable flight, constructing, by the one or more computing devices, a non-physics based model, based at least in part on the historical data and the flight data, correlating flight data with usage based life of the one or more components of the one or more gas turbine engines using a machine learning technique;
    accessing, by the one or more computing devices, the non-physics based model; and determining, by the one or more computing devices, a remaining usage based life of the one or more components based at least in part on the non-physics based model and the flight data.

\* \* \* \* \*